United States Patent [19]

Hatta

[11] Patent Number: 4,826,751
[45] Date of Patent: May 2, 1989

[54] TRANSFER-TYPE PHOTO-SENSITIVE SHEET

[75] Inventor: Naoyuki Hatta, Gamagori, Japan

[73] Assignee: Brother Kogyo Kabushiki Kaisha, Japan

[21] Appl. No.: 112,219

[22] Filed: Oct. 26, 1987

[30] Foreign Application Priority Data

Oct. 27, 1986 [JP] Japan .................... 61-164830[U]

[51] Int. Cl.$^4$ .................... G03C 1/40; G03C 1/00
[52] U.S. Cl. .................... 430/138; 430/211; 430/235; 430/254
[58] Field of Search ............ 430/138, 211, 235, 254

[56] References Cited

U.S. PATENT DOCUMENTS 4,399,209  8/1983  Sanders et al.
4,532,200  7/1985  Arney et al. .................... 430/138
4,536,463  8/1985  Sanders .......................... 430/138
4,551,407 11/1985  Sanders et al. .................. 430/138
4,562,137 12/1985  Sanders .......................... 430/138
4,622,282 11/1986  Head et al. ...................... 430/138
4,701,397 10/1987  Rourke et al. ................... 430/138

Primary Examiner—Mukund J. Shah
Attorney, Agent, or Firm—Oliff & Berridge

[57] ABSTRACT

In a transfer-type photo-sensitive sheet including; a photo-sensitive sheet coated with plurality microcapsules, each microcapsule encapsulating chromogenic material and photo-sensitive resin, and a transfer sheet coated with developing agent which causes development reaction in contact with chromogenic material effused from the microcapsules on the photo-sensitive sheet under pressure, wherein the photo-sensitive sheet is larger than the transfer sheet in size, an improvement characterized by that the microcapsules are only coated on equal to or less than the area, superimposed on the transfer sheet, of the photo-sensitive sheet.

4 Claims, 3 Drawing Sheets

TRANSFER-TYPE PHOTO-SENSITIVE SHEET

BACKGROUND OF THE INVENTION

1. Field of the Invention

The present invention relates to a transfer-type photo-sensitive sheet suitable for a printing paper for a light printing device such as a light printer and a copier.

2. Prior Art

A transfer-type photo-sensitive sheet comprises a photo-sensitive sheet coated with microcapsules containing chromogen, photo-sensitive resin, photo sensitizer, polymerization initiator and others, and a transfer sheet coated with developing agent which causes development reaction on the chromogen. U.S. Pat. No. 4,399,209 discloses such photo-sensitive sheet.

For example, if this transfer-type photo-sensitive sheet is used for a copier, as shown in a schematic illustration of FIG. 5, light emitted from a light source 1 scans a surface of an original 2 and the reflected light is struck on the surface of a photo-sensitive sheet 4 via a lens 3 to form a light latent image thereon. Subsequently, a transfer sheet 5 fed by a transfer sheet feed roller 7 of another system is superimposed on the photo-sensitive sheet 4 to be fed between pressure developing rollers 6. Thus, non-hardening microcapsules on the photo-sensitive sheet 4 are broken by pressure and development reaction is caused by chromogen therein and developing agent on the transfer sheet 5, thereby allowing an image to appear on the transfer sheet In this case, in order to develop the image up to the circumferential end of the transfer sheet 5, as shown in FIG. 6, when a photo-sensitive sheet 4 and a transfer sheet 5 are used in a form of cut sheet, the circumferential ends of the photosensitive sheet 4 project from the transfer sheet 5. As shown in FIG. 7, when the sheets 4 and 5 form a roll sheet respectively, the photo-sensitive sheet 4 is wider than the transfer sheet 5.

However, prior to the present invention, the whole surface of the photo-sensitive sheet 4 is coated with the microcapsules 8 as shown in FIGS. 6 and 7, whether it is a cut paper or a roll one. Accordingly, as shown in FIG. 8, when the photo-sensitive sheet 4 with the transfer sheet 5 superimposed thereon is fed through the transfer rollers 6, the non-hardening microcapsules 8 on the photosensitive sheet 4 are then broken by the pressure of the transfer rollers. Since the circumferential ends of the photo-sensitive sheet 4 project from the transfer sheet 5, the chromogenic materials and the photo-sensitive resin encapsulated in the microcapsules adhere to the surface of the transfer rollers on which only the photo-sensitive sheet 4 passes. The gradual accumulation of the attachment due to the continuative use of a light printing device causes fluctuation of a preset pressure of the pressure developing rollers 6, resulting in that the non-hardening microcapsules 8 are not entirely broken by pressure of the rollers 6. In other words, uneven development of the transfer sheet 5 is caused thereby. Further, there is some trouble for maintenance in that the frequent cleaning of the pressure developing rollers 6 is required since the attachment thereof makes the sequential transfer sheet dirty.

SUMMARY OF THE INVENTION

An object of the present invention is to provide a transfer-type photo-sensitive sheet so as not to attach chromogen, photo-sensitive resin and others to pressure developing rollers by pressure breaking of microcapsules, by setting a microcapsule non-coated area surrounding a transfer sheet on a photo-sensitive sheet when the photo-sensitive sheet coated with the microcapsules containing chromogen and photo-sensitive resin and the transfer sheet coated with developing agent which causes development reaction on the chromogen are superimposed on each other for pressure developing process.

Another object of the present invention is to provide the transfer-type photo-sensitive sheet with a means of not bringing a microcapsule-coated area of the photo-sensitive sheet into contact with the pressure developing rollers and thus to avoid the dirty accumulation through adhesion of the microcapsules.

A third object of the present invention is to provide the transfer-type photo-sensitive sheet so as not to make the sequential transfer sheet dirty.

A fourth object of the present invention is to provide the transfer-type photo-sensitive sheet which can offer a permanently stable developing process when it is used for printing paper of a light printer or a copier.

A fifth object of the present invention is to provide easier maintenance of the pressure developing rollers.

A sixth object of the present invention is to save paper cost due to smaller coat quantity of the microcapsules. In accordance with the present invention, in a transfer-type photo-sensitive sheet including; a photo-sensitive sheet coated with plurality microcapsules, each microcapsule encapsulating chromogenic material and photo-sensitive resin, and a transfer sheet coated with developing agent which causes development reaction in contact with chromogenic material effused from the microcapsules on the photosensitive sheet under pressure, wherein the photo-sensitive sheet is larger than the transfer sheet in size, an improvement characterized by that the microcapsules are only coated on equal to or less than the area, superimposed on the transfer sheet, of the photo-sensitive sheet.

BRIEF DESCRIPTION OF THE DRAWINGS

Other objects and features of the invention will become apparent to those skilled in the art as the disclosure is made in the following description of a preferred embodiment of the invention, as illustrated in the accompanying sheets of drawings, in which.

DETAILED DESCRIPTION OF THE PREFERRED EMBODIMENT

Hereinafter, a preferred embodiment of the present invention will be described in detail referring to the accompanying drawings.

Figure 1:
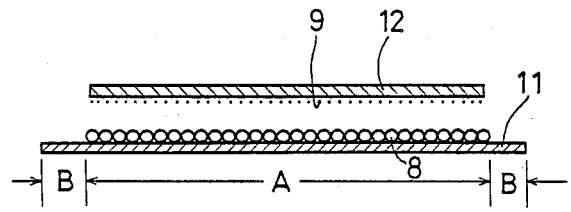
FIG. 1 is a sectional view of a transfer-type photosensitive sheet in an embodiment of the present invention.
Figure 2:
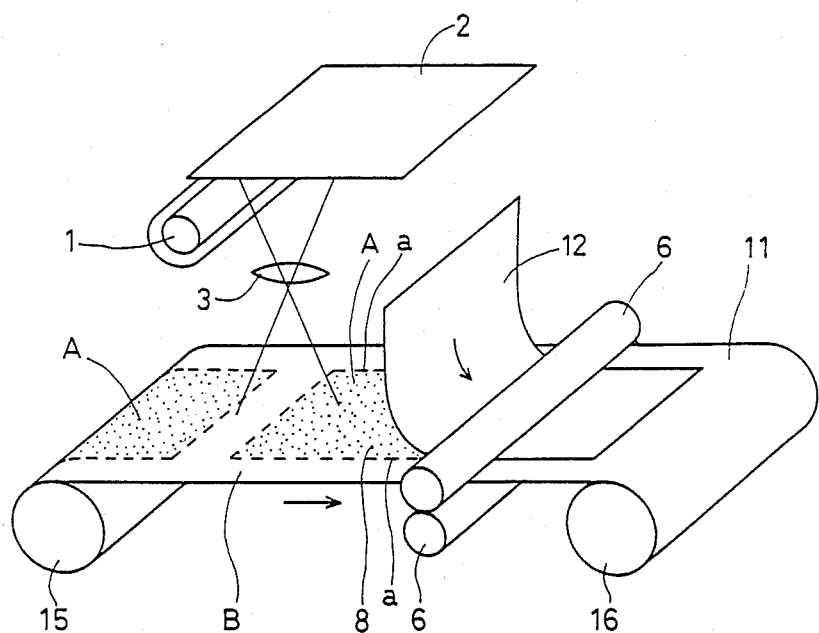
FIG. 2 is a schematic illustration when the photosensitive sheet is used for a copier.
Figure 3:
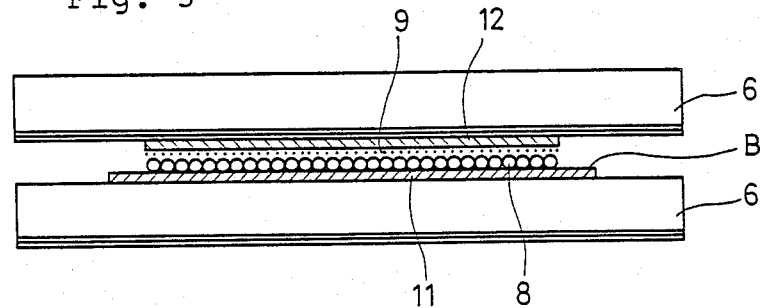
FIG. 3 is a sectional view showing the process of pressure development of the photo-sensitive sheet.

A transfer-type photo-sensitive sheet uses a roll paper as a photo-sensitive sheet 11 and a cut paper as a transfer sheet 12 as shown in FIGS. 1 through 3. In this case, the photo-sensitive sheet 11 is wider than the transfer sheet 12 in width. An area A coated with microcapsules 8, which corresponds to the transfer sheet 12 in size, is formed on the photo-sensitive sheet 11 at constant intervals in its feed direction, while two areas B along the longitudinal sides 'a' of the area A on the photo-sensitive sheet 11 are not coated thereon. The whole surface of the transfer sheet 12 is coated with developing agent 9 similar to a conventional one.

FIG. 2 is a schematic illustration when the transfer-type photo-sensitive sheet 11 is used for a copier. As shown in FIG. 2, the photo-sensitive sheet is fed from an uncoiler 15 to a recoiler 16 in the direction of the arrow. In this process, light emitted from a light source 1 scans a surface of an original 2 and is struck on the area A coated with the microcapsules 8 of the photo-sensitive sheet 11 via a lens 3, so that the microcapsules 8 thereon senses the light to form a light latent image corresponding to the image of the original 2. Subsequently, the transfer sheet 12 is superimposed on the microcapsule-coated area A of the photosensitive sheet 11 on which the light latent image is formed, and the superimposed sheets are fed between pressure developing rollers 6 to form the image on the transfer sheet 12. FIG. 3 is an enlarged view showing how the superimposed photo-sensitive sheet 11 and transfer sheet 12 are fed between the pressure developing rollers 6. As is clearly shown in FIGS. 1 and 3, the microcapsules 8 do not attach to the peripheral surfaces of the pressure developing rollers 6 in the areas B, because the areas B are not coated with microcapsules 8.

Though not shown in the figures of the above embodiment, some appropriate designs have been adopted such that a computer control is introduced to perfectly superimpose the transfer sheet 12 on the microcapsule-coated area A of the photo-sensitive sheet 11 and the transfer sheet 12 can be fed in accordance with a sensing signal generated by a position sensor which senses marks affixed at each corner of the microcapsule-coated area A.

Figure 4:
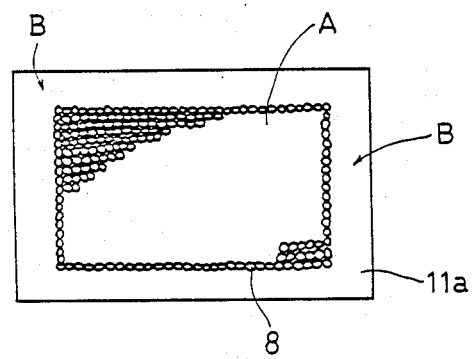
FIG. 4 is a front view of a photo-sensitive sheet in another embodiment of the present invention.
Figure 5:
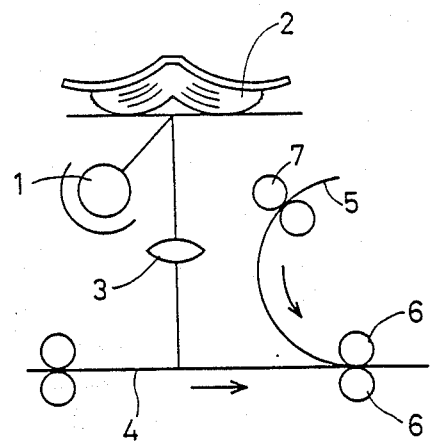
FIG. 5 is a schematic illustration of a conventional copier which uses the transfer-type photo-sensitive sheet.
Figure 6:
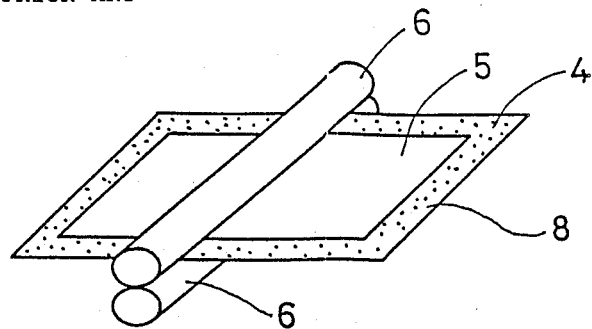
FIG. 6 is an outer perspective view of a conventional transfer-type photo-sensitive paper.
Figure 7:
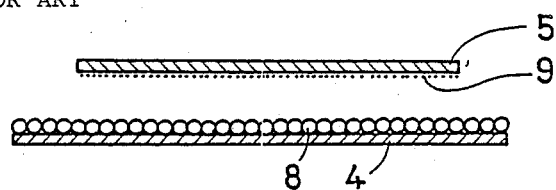
FIG. 7 is an enlarged sectional view of FIG. 6 taken on line VII-VII.
Figure 8:
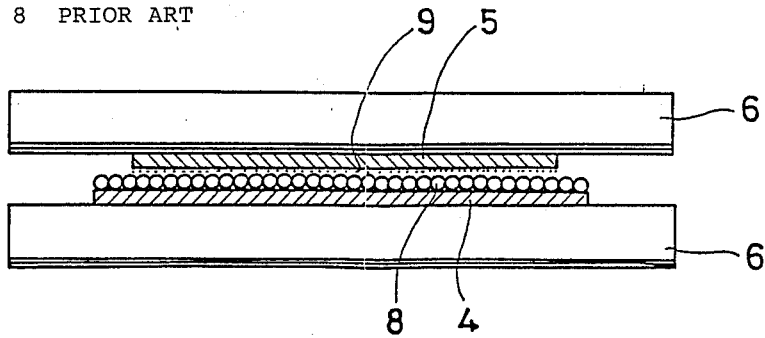
FIG. 8 is a view showing the process of the pressure development in FIG. 6.

On the other hand, as shown in FIG. 4, when the cut paper is used for a photo-sensitive sheet 11a similar to the transfer sheet 12, the area where the photo-sensitive sheet 11a and the transfer sheet 12 are superimposed on each other and the area surrounding the transfer sheet 12 on the photosensitive sheet 11a are equivalent to the microcapsule-coated area A and the microcapsule-noncoated area B, respectively. It is needless to say that this case may get the same effect as the aforementioned one.

As shown in FIG. 3, if the photo-sensitive sheet 11 having the microcapsule-noncoated area B is larger than the transfer sheet 12 in size, only the upper of the developing rollers 6 becomes dirty due to the microcapsules 8 broken by pressure thereof. Further, if the area coated with the microcapsules 8 on the photo-sensitive sheet 11 is smaller than the transfer sheet 12, neither of the developing rollers 6 becomes dirty.

Obviously, many modifications and variations of the present invention are possible in the light of the above teachings. It is therefore to be understood that within the scope of the appended claims, the invention may be practiced otherwise than as specifically described.

What is claimed is:

1. In a transfer-type photo-sensitive sheet comprising:
   a photo-sensitive sheet coated with a plurality of microcapsules, each microcapsule encapsulating chromogenic material and photo-sensitive resin; and
   a transfer sheet coated with developing agent which causes development reaction in contact with chromogenic material effused from the microcapsules on the photo-sensitive sheet under pressure;
   wherein the photo-sensitive sheet is larger than the transfer sheet is size; and
   wherein the microcapsules are only coated on the photo-sensitive sheet to cover an area equal to or less than the area of the transfer sheet.

2. A transfer-type photo-sensitive sheet according to claim 1 wherein a roll paper is used as the photo-sensitive sheet.

3. A transfer-type photo-sensitive sheet according to claim 1 wherein an individual cut paper is used as the photosensitive sheet and the transfer sheet.

4. A transfer-type photo-sensitive sheet according to claim 1 wherein the sheet is used for a copier.

* * * * *